United States Patent
Baccini

(10) Patent No.: US 7,568,879 B2
(45) Date of Patent: Aug. 4, 2009

(54) ROBOTIZED DEVICE TO MOVE AN OBJECT

(75) Inventor: Gisulfo Baccini, Mignagola Di Carbonera (IT)

(73) Assignee: AFCO C.V., Amsterdam (NL)

( * ) Notice: Subject to any disclaimer, the term of this patent is extended or adjusted under 35 U.S.C. 154(b) by 191 days.

(21) Appl. No.: 11/518,687

(22) Filed: Sep. 11, 2006

(65) Prior Publication Data
US 2007/0081882 A1 Apr. 12, 2007

(30) Foreign Application Priority Data
Sep. 26, 2005 (IT) .......................... UD2005A0158

(51) Int. Cl.
*B25J 9/06* (2006.01)
(52) U.S. Cl. ................. 414/729; 74/490.01; 74/490.09; 414/917
(58) Field of Classification Search ............. 414/749.1, 414/752.1, 917, 591, 729, 735; 212/342; 74/490.01, 490.08, 490.09
See application file for complete search history.

(56) References Cited
U.S. PATENT DOCUMENTS

| | | | | |
|---|---|---|---|---|
| 4,976,582 A | * | 12/1990 | Clavel | .......................... 414/729 |
| 5,037,267 A | * | 8/1991 | Warner et al. | ............. 414/744.6 |
| 5,271,707 A | * | 12/1993 | Derksen et al. | ............. 414/680 |
| 5,344,202 A | * | 9/1994 | Ramler et al. | .............. 294/64.1 |
| 6,286,387 B1 | | 9/2001 | Adachi et al. | |
| 6,370,748 B1 | | 4/2002 | Baccini | |
| 7,331,750 B2 | * | 2/2008 | Merz et al. | ................... 414/735 |
| 2003/0151379 A1 | | 8/2003 | Gosselin et al. | |
| 2005/0092121 A1 | * | 5/2005 | Huang et al. | ............. 74/490.01 |

FOREIGN PATENT DOCUMENTS

WO      WO 03/076225         9/2003

* cited by examiner

*Primary Examiner*—Donald Underwood
(74) *Attorney, Agent, or Firm*—Hamre, Schumann, Mueller & Larson, P.C.

(57) ABSTRACT

Robotized device to move an object, comprising a manipulator having gripping elements lying on a determinate plane of manipulation, a first electric motor with which a first movement unit is associated, in turn associated with the manipulator, and a second electric motor with which a second movement unit is associated, in turn associated with the manipulator, wherein the first movement unit and the second movement unit define with the respective motor and with the manipulator a pantograph mechanism. The first movement unit comprises connection elements able to keep the gripping elements substantially parallel to the plane of manipulation during the functioning of the pantograph mechanism.

4 Claims, 5 Drawing Sheets

ROBOTIZED DEVICE TO MOVE AN OBJECT

FIELD OF THE INVENTION

The present invention concerns a robotized device to move an object, such as for example a supporting plate for electronic circuits, between a feed line and one or more work stations.

BACKGROUND OF THE INVENTION

In the field of production of electronic circuits, particularly multi-layer circuits, it is known, as described for example in the Italian patent of industrial invention IT-B-1310557, granted on 18.02.2002 in the name of the present Applicant, to use elementary circuits each made on a base support which is disposed on a supporting plate and which comprises one or more sheets of insulating material, consisting of aluminum, or synthetic materials, and also called Greentape®.

In the course of the different working steps of said circuits, each supporting plate is moved by the manipulator of a robotized device between a feed line and one or more work stations, normally disposed at the side of the feed line.

The robotized device is required to position the plate, keeping it horizontal so as to pick it up from, and deposit it correctly onto, the feed line or the work station.

Known devices generally comprise one or more robotized arms connected to the manipulator, which do not guarantee, however, that the manipulator, and therefore the plate, is maintained perfectly horizontal, unless extremely complex and expensive mechanical and electronic solutions are used.

One purpose of the present invention is to achieve a device to move a manipulator element which allows to position objects at least between a feed line and one or more work stations, also disposed on different and offset planes with respect to the pick-up point, and which at the same time guarantees that the manipulator element, and hence the object to be manipulated, is kept horizontal, even when there are high pick-up and depositing speeds.

The Applicant has devised, tested and embodied the present invention to overcome the shortcomings of the state of the art and to obtain these and other purposes and advantages.

SUMMARY OF THE INVENTION

The present invention is set forth and characterized in the main claim, while the dependent claims describe other characteristics of the invention or variants to the main inventive idea.

In accordance with the above purpose, a robotized device according to the present invention is used to move an object between a feed line and one or more work stations.

The robotized device comprises manipulator means having gripping elements, for example a sucker, lying on a determinate plane of manipulation, first motor means and second motor means, for example of the type comprising a fixed part or stator, and a movable part or rotor, and axes of rotation "Z1", "Z2" substantially parallel to each other.

The first motor means is associated with a first movement unit and, similarly, the second motor means is associated with a second movement unit.

The first movement unit and the second movement unit are in turn associated with the manipulator means, and define with the latter and with the respective motor means a pantograph mechanism.

The independent and coordinated energizing of the first motor means and the second motor means allows to translate the manipulator means both with respect to a first axis "X" and also with respect to a second axis "Y", orthogonal to the first axis "X" axes which lie on a plane orthogonal to the axes of rotation "Z1", "Z2" of the motor means.

Advantageously, the axis "X" is disposed substantially parallel to the straight line that joins the centers of rotation of the motor means and is for example horizontal, and the axis "Y" is disposed substantially equidistant from said centers and is for example vertical.

According to a characteristic of the present invention, at least one of the movement units comprises connection means able to keep the gripping elements substantially parallel to the plane of manipulation during the functioning of the pantograph mechanism.

In this way, the invention allows to position an object between the feed line and work stations disposed even on different planes with respect to the pick-up point, while still guaranteeing, thanks to the connection means, that the gripping elements and the plane of manipulation are parallel, and therefore that the operations to pick-up and deposit the object are performed correctly.

Thanks to the simplicity and effectiveness of the connection given by the connection means, it is possible to obtain high pick-up and deposit speeds and hence high productivity.

According to an advantageous solution of the invention, the first motor means and the second motor means are disposed on a support element connected to third motor means, able to selectively rotate the support element with respect to an axis "Y1", disposed for example orthogonal to the axis of rotation of the first motor means and the second motor means and equidistant therefrom.

Thanks to this solution, the robotized device according to the invention allows to position and deposit an object between the feed line and work stations disposed even on planes laterally offset with respect to the pick-up point.

BRIEF DESCRIPTION OF THE DRAWINGS

These and other characteristics of the present invention will become apparent from the following description of a preferential form of embodiment, given as a non-restrictive example with reference to the attached drawings wherein.

DETAILED DESCRIPTION OF A PREFERENTIAL FORM OF EMBODIMENT

Figure 1:
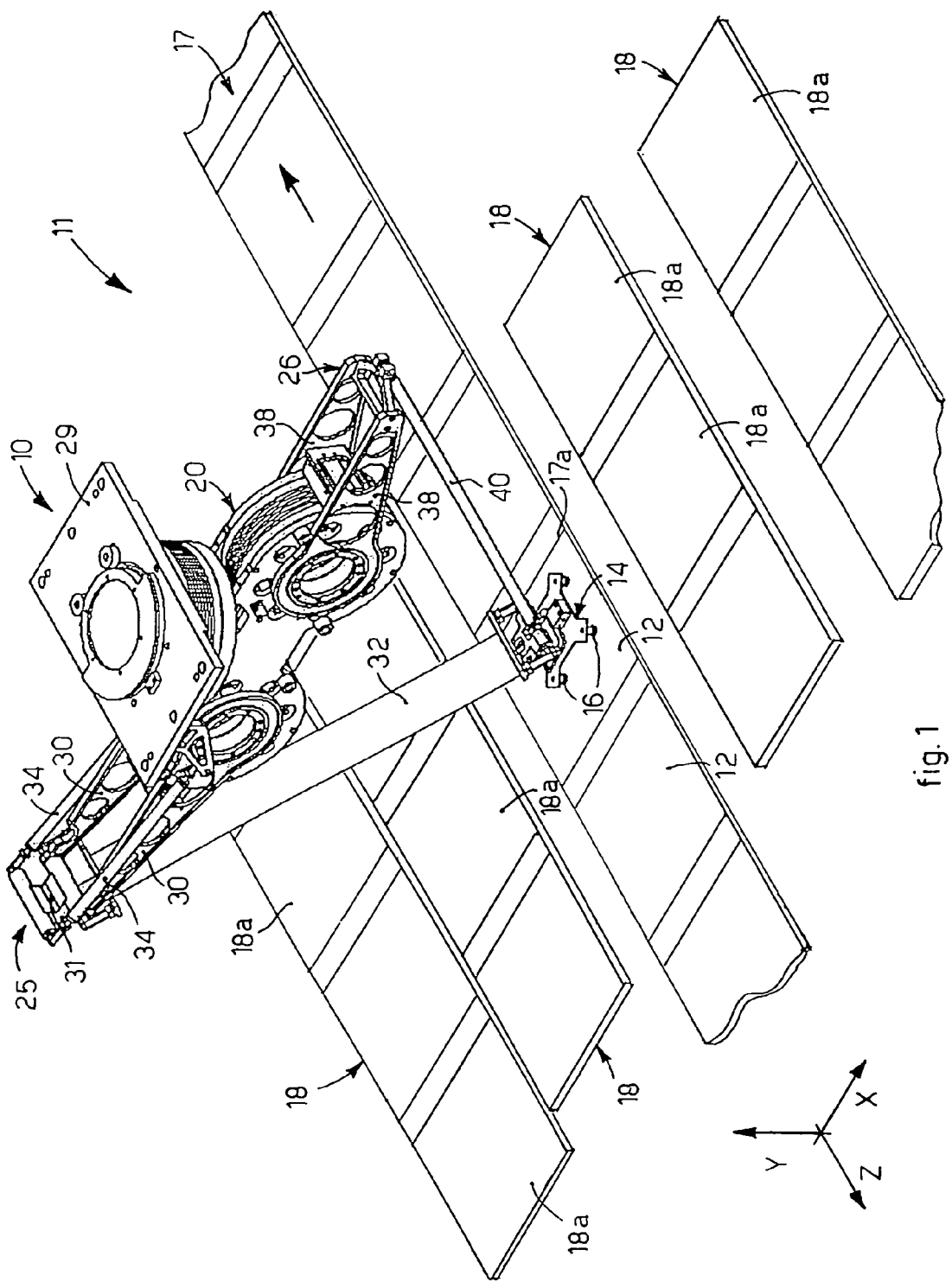
FIG. 1 is a three-dimensional view of a plant to produce electronic circuits in which a robotized device according to the present invention is used.

With reference to FIG. 1, a robotized device 10 according to the present invention is used in a plant 11 to produce electronic circuits, in order to move plates 12 on which a base support, called Greentape®, is disposed.

Figure 2:
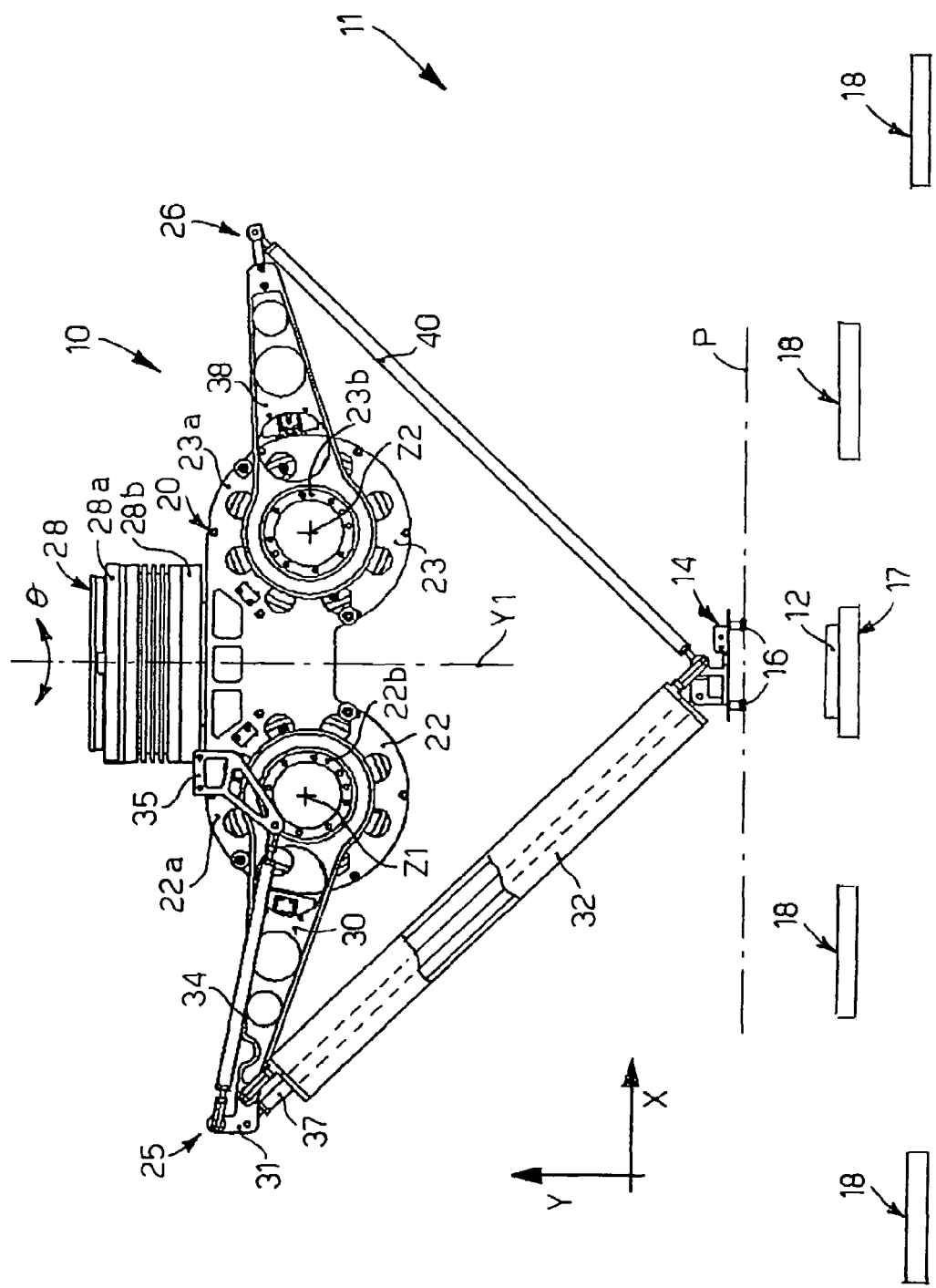
FIG. 2 is a lateral view of the plant in FIG. 1.
Figure 3:
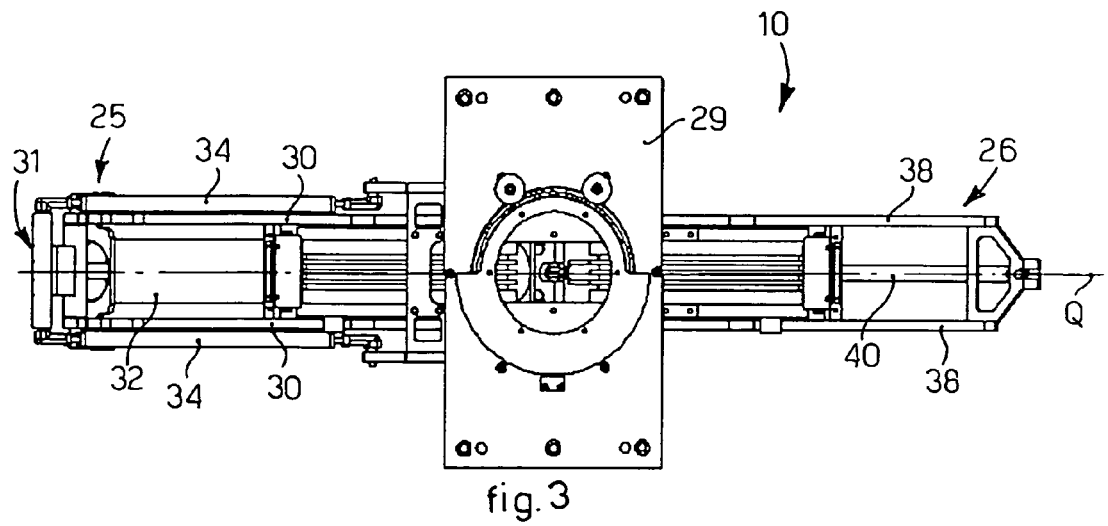
FIG. 3 is a plane view of the device in FIG. 1.
Figure 4:
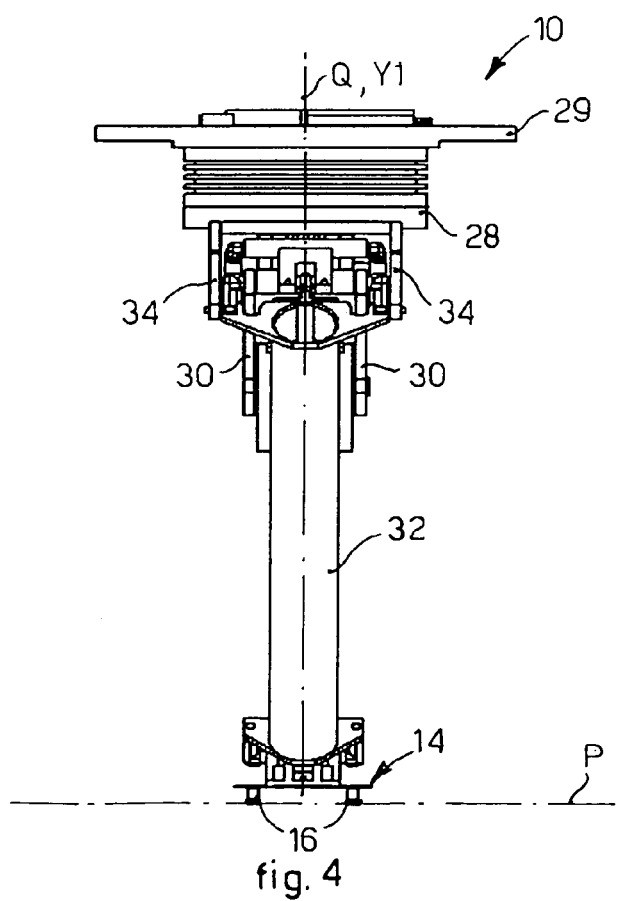
FIG. 4 is another lateral view of the device in FIG. 1.

The robotized device 10 comprises a manipulator 14 having four suckers 16 (FIGS. 1 and 2) lying on a determinate plane of manipulation P and able to clamp a plate 12, temporarily and selectively, to move it between a pick-up point 17a of a feed line 17 and a working point 18a in a work station 18.

The robotized device 10 also comprises a support element 20 on which two electric torque motors are mounted, respectively first 22 and second 23, of the step-wise type and comprising a respective stator 22a, 23a and a respective rotor 22b, 23b.

The rotor 22b of the first motor 22 is mechanically connected to a first movement unit 25, in turn connected to the manipulator 14, and the rotor 23b of the second motor 23 is mechanically connected to a second movement unit 26, in turn connected to the manipulator 14. The axes of rotation Z1 and Z2 of the two motors 22 and 23 are parallel to each other and substantially horizontal.

The robotized device 10 also comprises a third electric torque motor 28 whose stator 28a is solid with an external support 29, in turn solid with a beam, not shown, and whose rotor 28b is solid with the support element 20, so as to make it rotate selectively with respect to an axis of rotation Y1 according to an axis of rotation θ.

The axis of rotation Y1 of the third motor 28 is substantially vertical and orthogonal to the axes of rotation Z1 and Z2 of the first and second motor 22 and 23 and equidistant from said axes, so as to orient the support element 20 on an arc of 360°.

Figure 5:
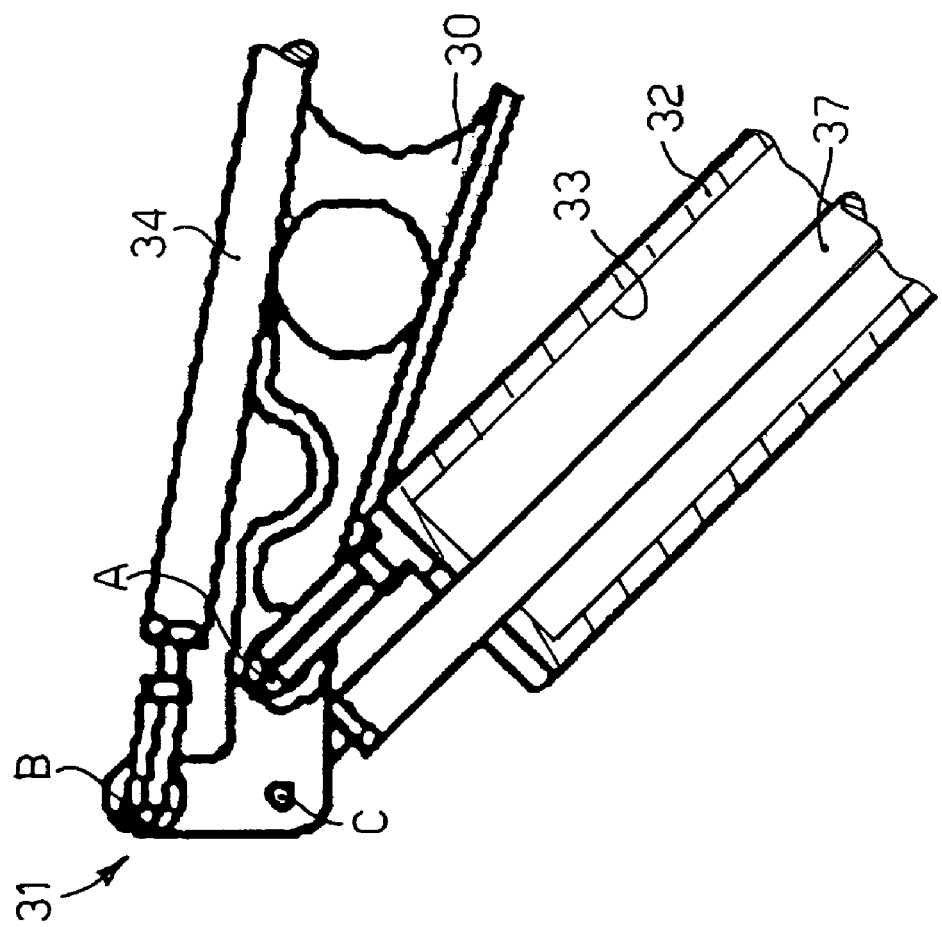
FIG. 5 is a detail of the device in FIG. 2.

The first movement unit 25 comprises a pair of first arms 30 (FIGS. 1 to 4) parallel to each other and connected to the rotor 22b of the first motor 22 and by means of a toggle lever 31 to a tubular element 32 made of carbon and pivoted in turn to the manipulator 14; the two first arms 30 and the tubular element 32 (FIG. 5) are pivoted with respect to a same pivoting axis A on the toggle lever 31.

The first movement unit 25 also comprises a pair of rigid tie-rods 34 (FIGS. 1 to 4) pivoted to the support element 20 by means of a respective armlet 35 and connected by means of the toggle lever 31 to a first rod 37 pivoted in turn to the manipulator 14, with respect to a different pivoting axis from that of the tubular element 32.

The tubular element 32 defines a cavity 33 (FIG. 5) inside which the first rod 37 is inserted and is free to translate at least longitudinally.

The two rigid tie-rods 34 are pivoted on the toggle lever 31 with respect to a pivoting axis B, while the first rod 37 is pivoted on the toggle lever 31 with respect to a pivoting axis C.

The three pivoting axes A, B and C are different from each other and substantially parallel, so that the pair of first arms 30 and the pair of tie-rods 34 define a first parallelogram, while the tubular element 32 and the first rod 37 define a second parallelogram.

The second movement unit 26 (FIGS. 1 to 4) comprises a pair of second arms 38 connected to the rotor of the second motor 23 and to a second rod 40 pivoted in turn to the manipulator 14 with respect to a pivoting axis coinciding with that of the tubular element 32.

The robotized device 10 is therefore balanced with respect to a plane Q (FIGS. 3 and 4) orthogonal to the plane of manipulation P and passing through the axis of rotation Y1 of the third motor 28.

According to the invention, the three motors 22, 23 and 28 can be energized in an independent and coordinated manner. In this way, by energizing the first motor 22, the angular position of its rotor 22b is varied; the two first arms 30 remain parallel to the two tie-rods 34, the tubular element 32 remains parallel to the first rod 37, and the manipulator 14 is moved so that the suckers 16 always lie on a plane substantially parallel to said determinate plane of manipulation P.

The coordinated energizing of the second motor 23 allows to vary the angular position of its rotor, and to selectively move the manipulator 14 both along a horizontal axis X and also along a vertical axis Y.

Moreover, the energizing of the third motor 28 allows the support element 20 to rotate, which allows the manipulator 14 to translate also along a horizontal axis Z orthogonal to the horizontal axis X.

Figure 6:
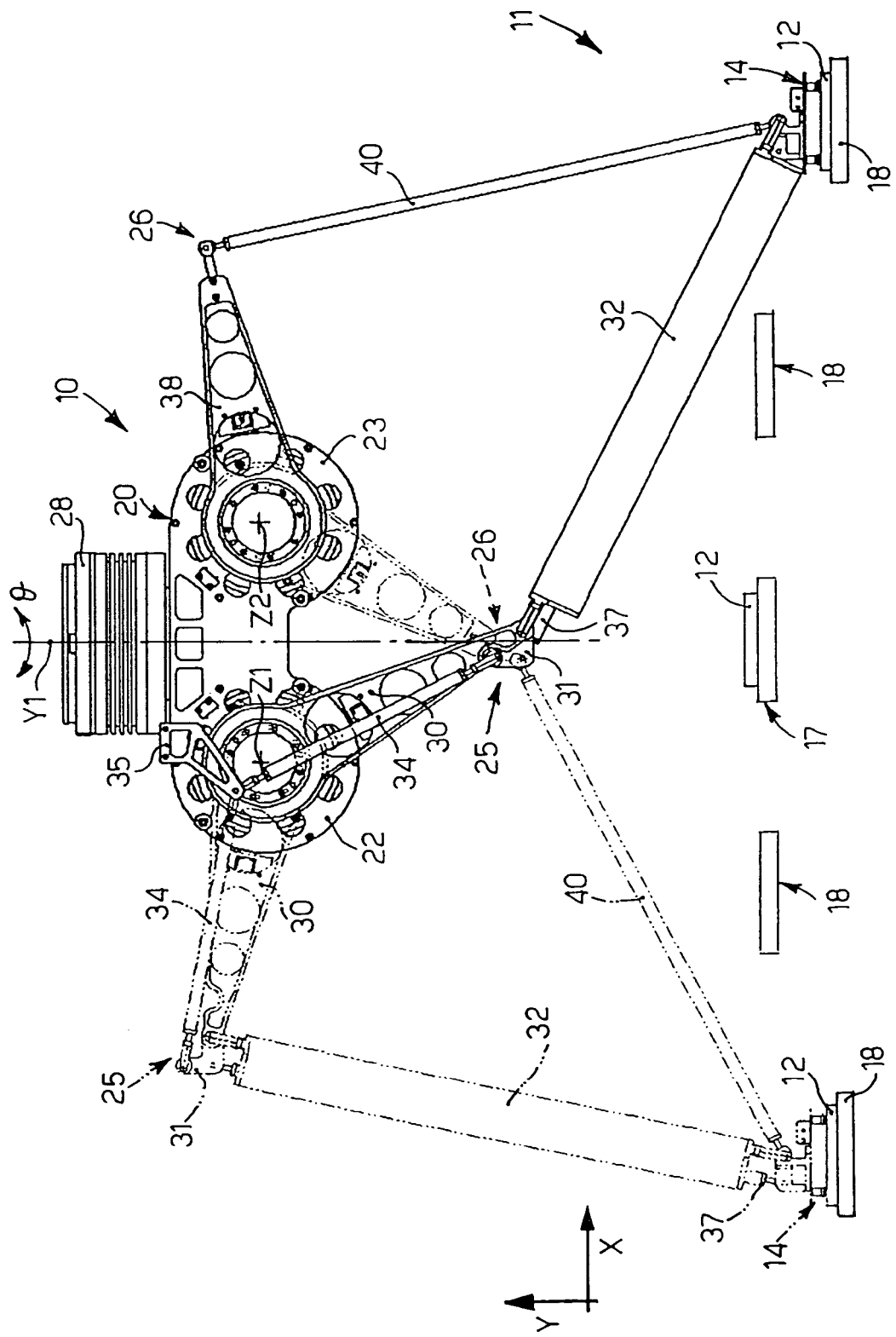
FIG. 6 is a lateral view of the device in FIG. 2 in two different operating positions.

As shown in FIG. 6, the robotized device 10 in this way allows to position the plate 12 between the feed line 17 and work stations 18 disposed on different planes, offset laterally with respect to the pick-up point.

It is clear that modifications and/or additions of parts may be made to the robotized device 10 as described heretofore, without departing from the field and scope of the present invention.

It is also clear that, although the present invention has been described with reference to some specific examples, a person of skill in the art shall certainly be able to achieve many other equivalent forms of robotized device to move objects, having the characteristics as set forth in the claims and hence all coming within the field of protection defined thereby.

The invention claimed is:

1. Robotized device to move an object, comprising:
   a support element;
   a pantograph mechanism including:
      a manipulator element with gripping elements adapted to grip said object, said gripping elements lying on a determinate plane of manipulation;
      a first motor mounted to said support element;
      a first movement unit connected among said first motor, said support element and said manipulator element, said first movement unit including:
         a toggle lever;
         a tie-rod pivotally connected between said support element and said toggle lever;
         a first arm connected for rotation with said first motor and pivotally connected to said toggle lever, wherein said tie-rod and said first arm rotate in parallel with one another;
         a rigid element pivotally connected between said toggle lever and said manipulator element;
         a first rod pivotally connected between said toggle lever and said manipulator element;
      a second motor mounted to said support element;
      a second movement unit between said second motor and said manipulator element, said second movement unit including:
         a second arm connected for rotation with said second motor;
         a second rod pivotally connected between said second arm and said manipulator element, said rigid element and said second rod being pivotally connected to said manipulator element along a common axis;
a third motor whose rotor is solid with said support element so as to make it rotate selectively with respect to an axis of rotation substantially vertical,
wherein said first motor and said second motor have respective axes of rotation that are parallel to each other and substantially horizontal,
wherein the axis of rotation of said third motor is substantially vertical and orthogonal to the axes of rotation of said first and second motor and equidistant from said axes, so as to orient said support element on an arc of 360°, and
wherein said object is moved while said gripping elements during movement lie substantially parallel to said determinate plane of manipulation.

2. Robotized device as in claim 1, wherein said rigid element is tubular and defines a cavity inside which said first rod is inserted and is free to translate longitudinally.

3. Robotized device as in claim 2, wherein said tubular element is made of carbon.

4. Robotized device as in claim 1, wherein each of said first motor, said second motor, and said third motor are step-wise in function.

* * * * *